(12) United States Patent
Xue et al.

(10) Patent No.: US 11,385,256 B2
(45) Date of Patent: Jul. 12, 2022

(54) IN-SITU TESTING DEVICE

(71) Applicant: TSINGHUA UNIVERSITY, Beijing (CN)

(72) Inventors: Qi-Kun Xue, Beijing (CN); Xiao-Peng Hu, Beijing (CN); Cheng Zheng, Beijing (CN); Xi Chen, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 17/121,589

(22) Filed: Dec. 14, 2020

(65) Prior Publication Data
US 2021/0096155 A1 Apr. 1, 2021

Related U.S. Application Data

(63) Continuation of application No. PCT/CN2018/092909, filed on Feb. 26, 2018.

(30) Foreign Application Priority Data

Jun. 12, 2018 (CN) .......................... 201810602650.1

(51) Int. Cl.
| G01R 1/073 | (2006.01) |
|---|---|
| G01N 3/02 | (2006.01) |
| G01N 3/06 | (2006.01) |
| G01N 3/08 | (2006.01) |
| G01N 3/20 | (2006.01) |
| G01N 3/22 | (2006.01) |
| G01R 1/04 | (2006.01) |
| G01R 1/067 | (2006.01) |

(52) U.S. Cl.
CPC .............. *G01R 1/04* (2013.01); *G01R 1/067* (2013.01)

(58) Field of Classification Search
CPC .......... G01R 1/04; G01R 1/067; G01R 1/073; G01N 3/02; G01N 3/06; G01N 3/08; G01N 3/20; G01N 3/22
See application file for complete search history.

(56) References Cited

U.S. PATENT DOCUMENTS

2013/0319127 A1* 12/2013 Vodnick ............... G01B 21/047
73/788

FOREIGN PATENT DOCUMENTS

| CN | 104749470 | * | 8/2011 | ............. G01R 1/073 |
|---|---|---|---|---|
| CN | 103792443 | | 5/2014 | |
| CN | 104749470 | | 7/2015 | |
| EP | 2073250 | | 6/2009 | |

OTHER PUBLICATIONS

International Search Report of PCT/CN2018/092909.

* cited by examiner

Primary Examiner — Neel D Shah

(57) ABSTRACT

The present disclosure relates to an in-situ testing device including a measuring head, a drive mechanism, and a testing chamber. The testing chamber is provided with a first optical observation hole. The measuring head is provided with a second optical observation hole. The testing chamber is provided with an opening allowing the measuring head to pass. The testing chamber is further provided with a shielding door, and the drive mechanism is connected to the shielding door to drive the shielding door to move relative to the testing chamber, to open or cover the opening, thereby opening or closing the testing chamber.

19 Claims, 8 Drawing Sheets

IN-SITU TESTING DEVICE

CROSS-REFERENCE TO RELATED APPLICATIONS

This application claims all benefits accruing under 35 U.S.C. § 119 from China Patent Application No. 201810602650.1, filed on Jun. 12, 2018 in the China National Intellectual Property Administration, the entire content of which is hereby incorporated by reference. This application is a continuation under 35 U.S.C. § 120 of international patent application PCT/CN2018/092909, entitled "In-Situ Testing Device" filed on Jun. 26, 2018, the content of which is also hereby incorporated by reference.

TECHNICAL FIELD

The present disclosure relates to the technical field of ultra-high vacuum experiment, in particular to an in-situ testing device.

BACKGROUND

Samples can be well protected in an ultra-high vacuum. In ultra-high vacuum experiments, different measurement environments (such as different temperature ranges, different magnetic field intensities, etc.) are generally created and maintained by different means, and are physically located in different spatial positions. However, during an experiment, it is often required to test a single sample in different environments.

During an experiment, a tester must ensure that the sample is aligned with a probe. When the sample is moved to different test environments, a new probe cannot be aligned with the specified position of the sample again due to limitations of observation conditions and other factors. Therefore, when the sample is moved to a different test environment, it is necessary for the tester to align the probe with an electrode on the sample by an optical observation method before data are collected.

However, in an ultra-high vacuum experiment, the optical observation method cannot be performed in some test environments. For example, the optical observation method cannot be implemented in a Dewar. Therefore, it is necessary for the tester to take the sample out from the ultra-high vacuum environment, align the probe with the electrode on the sample at a position where the optical observation can be performed, and after a preliminary test, combine the probe and the sample to form a measuring probe, and send the measuring probe to a designated position in the Dewar. Therefore, the operation is relatively cumbersome, and the test efficiency is low.

SUMMARY

In view of problems that the operation is relatively cumbersome and the test efficiency is low, an in-situ testing device with high test efficiency is provided.

The above objectives are achieved through the following technical solutions.

An in-situ testing device includes: a testing chamber arranged on a sample transport line of an ultra-high vacuum system, the testing chamber being provided with a first optical observation hole, the testing chamber being further provided with a shielding door;

a measuring head capable of being connected to the testing chamber, the measuring head being provided with a second optical observation hole whose position matches a position of the first optical observation hole, the testing chamber being provided with an opening allowing the measuring head to pass;

a drive mechanism connected to the shielding door, and configured to drive the shielding door to move relative to the testing chamber, to open or cover the opening, thereby opening or closing the testing chamber.

In one of the embodiments, the drive mechanism includes a first power unit and a first transmission structure; the first power unit is connected to the first transmission structure; and the first transmission structure is connected to the shielding door and drives the shielding door.

In one of the embodiments, the opening extends from an end of the testing chamber to a side wall of the testing chamber; the shielding door is L-shaped; and one edge of the shielding door is rotatably connected to the side wall of the testing chamber.

In one of the embodiments, the first transmission structure includes a first driving gear and a first driven gear; the shielding door is provided with a door shaft; the door shaft is rotatably connected to the testing chamber; and the first driven gear is sleeved over the door shaft;

the first power unit is a first magnetic force rotation hand; the first magnetic force rotation hand is connected to the first driving gear by a first long rod; and the first driving gear meshes with the first driven gear.

In one of the embodiments, the first long rod is connected to the first driving gear by a first universal joint.

In one of the embodiments, the in-situ testing device further includes an installing base; the testing chamber is arranged on the installing base, a bottom of the testing chamber has a through hole;

a locking structure is disposed on the installing base and below the through hole of the testing chamber;

an interference structure is disposed on the measuring head and fits the locking structure to fix the measuring head inside the testing chamber.

In one of the embodiments, the locking structure includes a second power unit, a second transmission structure and a threaded rod; the threaded rod is arranged on the installing base and extends into the testing chamber through the through hole;

the interference structure includes a threaded hole disposed on a bottom of the measuring head and fitting the threaded rod; the second power unit is connected to the threaded rod by the second transmission structure, and configured to drive the threaded rod to screw into the threaded hole, thereby fixing the measuring head inside the testing chamber.

In one of the embodiments, the second transmission structure includes a second driving gear and a second driven gear; the second driven gear is rotatably arranged in the installing base; the second driven gear is connected to the threaded rod;

the second power unit is a second magnetic force rotation hand; the second magnetic force rotation hand is connected to the second driving gear by a second long rod; and the second driving gear meshes with the second driven gear.

In one of the embodiments, the second long rod is connected to the second driving gear by a second universal joint.

In one of the embodiments, the threaded rod includes a first part, a second part, and an elastic member; the first part is rod-shaped and includes a threaded portion at an upper end and a cylindrical portion at a lower end; position restricting surfaces are disposed on opposite side walls of the cylindrical portion;

the second part is connected to the second driven gear; the second part has a receiving hole for receiving the cylindrical portion; and the elastic member is disposed inside the receiving hole and abuts against the cylindrical portion;

an insertion hole is disposed in a side wall of the receiving hole and penetrates the side wall thereof; a restricting member is configured to be inserted into the insertion hole and abut against the position restricting surfaces; and the first part is prevented from rotating relative to the second part.

In one of the embodiments, the in-situ testing device further includes a first electrode adapter plate arranged at a lower end of the measuring head; the testing chamber is provided with an electrode base oppositely joined to the first electrode adapter plate;

a plurality of grooves are asymmetrically disposed on the electrode base; a plurality of protrusions respectively fitting the plurality of grooves are disposed at the lower end of the measuring head; the plurality of grooves fit the plurality of protrusions; and the first electrode adapter plate is aligned with the electrode base.

In one of the embodiments, the in-situ testing device further includes a cold rod including an inner tube and an outer tube arranged concentrically; and a cooling component arranged at one end of the cold rod; the inner tube and the outer tube communicate by means of the cooling component;

the cooling component is connected to the testing chamber, and another end of the cold rod, which is away from the cooling component, communicates with an external cooling device in order to allow refrigerant to flow into the inner tube and flow out from the outer tube, thereby reducing a temperature of the measuring head.

In one of the embodiments, the in-situ testing device further includes a connecting board connected to the testing chamber, and the connecting board and the cooling component are provided with a plurality of third threaded holes corresponding to each other.

In one of the embodiments, the in-situ testing device further includes a second electrode adapter plate connected to one side of the connecting board, and a third electrode adapter plate is disposed on a side wall of the testing chamber and corresponds to the second electrode adapter plate.

In one of the embodiments, the in-situ testing device further includes a U-shaped wire combing rod arranged at a side of the third electrode adapter plate away from the second electrode adapter plate, and the U-shaped wire combing rod is configured to comb wires.

In one of the embodiments, the in-situ testing device further includes a first supporting member sleeved over the outer tube, and the first supporting member is configured to support the cold rod.

In one of the embodiments, the in-situ testing device further includes a connecting flange and a hollow linear propelling component, which are sleeved over the outer tube;

a first end of the connecting flange is provided with a second supporting member; and the second supporting member is provided with a first rod hole allowing the cold rod to pass; the first end of the connecting flange is configured to connect an external fixed component;

a first end of the hollow linear propelling component is connected to a second end of the connecting flange, and the second end of the connecting flange is away from the second supporting member; a second end of the hollow linear propelling component is connected to the cold rod; the hollow linear propelling component is configured to drive the cold rod to move, thereby driving the testing chamber to move.

In one of the embodiments, the in-situ testing device further includes a first adapter flange connected to the second end of the hollow linear propelling component away from the connecting flange; the cold rod is installed on the first adapter flange; and the hollow linear propelling component is connected to the cold rod through the first adapter flange.

In one of the embodiments, the in-situ testing device further includes a wiring tube sleeved over the outer tube, where one end of the wiring tube is connected to the first adapter flange, and another end of the wiring tube is welded to the outer tube;

multiple threading tubes disposed on the wiring tube, where each threading tube communicates with the wiring tube;

multiple first small flanges respectively disposed on ends of the multiple threading tubes away from the wiring tube, where the multiple first small flanges are configured to connect external devices;

inner walls of the wiring tube, the hollow linear propelling component, the connecting flange, and the first adapter flange are spaced from an outer wall of the outer tube to form space for receiving wires.

In one of the embodiments, the hollow linear propelling component includes an extendable-contractile tube, a support, a power structure, a third driving gear, a third driven gear, a threaded shaft, and a nut; the support is provided with a slide rail; a slide plate is slidably disposed on the slide rail; the nut is arranged on the slide plate; the third driven gear is rotatably disposed on the support and connected to one end of the threaded shaft; another end of the threaded shaft is rotatably disposed in the nut;

the power structure is arranged on the support and connected to the third driving gear to drive the third driving gear to rotate; the third driving gear meshes with the third driven gear;

two ends of the extendable-contractile tube each are provided with a second adapter flange; one end of the extendable-contractile tube is attached to the support by means of one second adapter flange and another end of the extendable-contractile tube is attached to the slide plate by means of another second adapter flange; the extendable-contractile tube is sleeved over the outer tube, and the two second adapter flanges are connected to the connecting flange and the first adapter flange respectively.

The beneficial effects of the present disclosure include:

The testing chamber of the in-situ testing device of the present disclosure is installed in an ultra-high vacuum test system. Before the sample is moved to a different test environment, the sample and the probe are placed in the measuring head, and the shielding door is opened by the drive mechanism. By means of the transportation device of the sample transport line in the ultra-high vacuum test system, the measuring head is placed into the testing chamber, so that the second optical observation hole of the measuring head is aligned with the first optical observation hole of the testing chamber. The sample is aligned with the probe by means of optical observation, and the preliminary test is performed to ensure that electrical properties are proper after the alignment; and then the measuring head is transported by the transportation device of the sample transport line to a designated position in a next testing environment. The in-situ testing device of the present invention provides the tester with a test platform for aligning the sample with the probe by means of optical observation and testing various electrical properties of the sample, which makes an automatic operation of the preliminary test of the sample possible. Thus, there is no need to take the sample out from the ultra-high vacuum test environment, which greatly reduces operation steps to be performed by the tester and improves test efficiency. Moreover, it is ensured that the sample is always in the vacuum environment during tests, thereby achieving a protection for surface properties of the sample.

DETAILED DESCRIPTION OF THE EMBODIMENTS

In order to make the objectives, technical solutions and advantages of the present disclosure clearer and better understood, an in-situ testing device of the present disclosure will be further described in detail below with reference to the accompanying drawings and embodiments. It should be understood that the specific embodiments described herein are merely illustration of the present disclosure, but not intended to limit the present disclosure.

Figure 1:
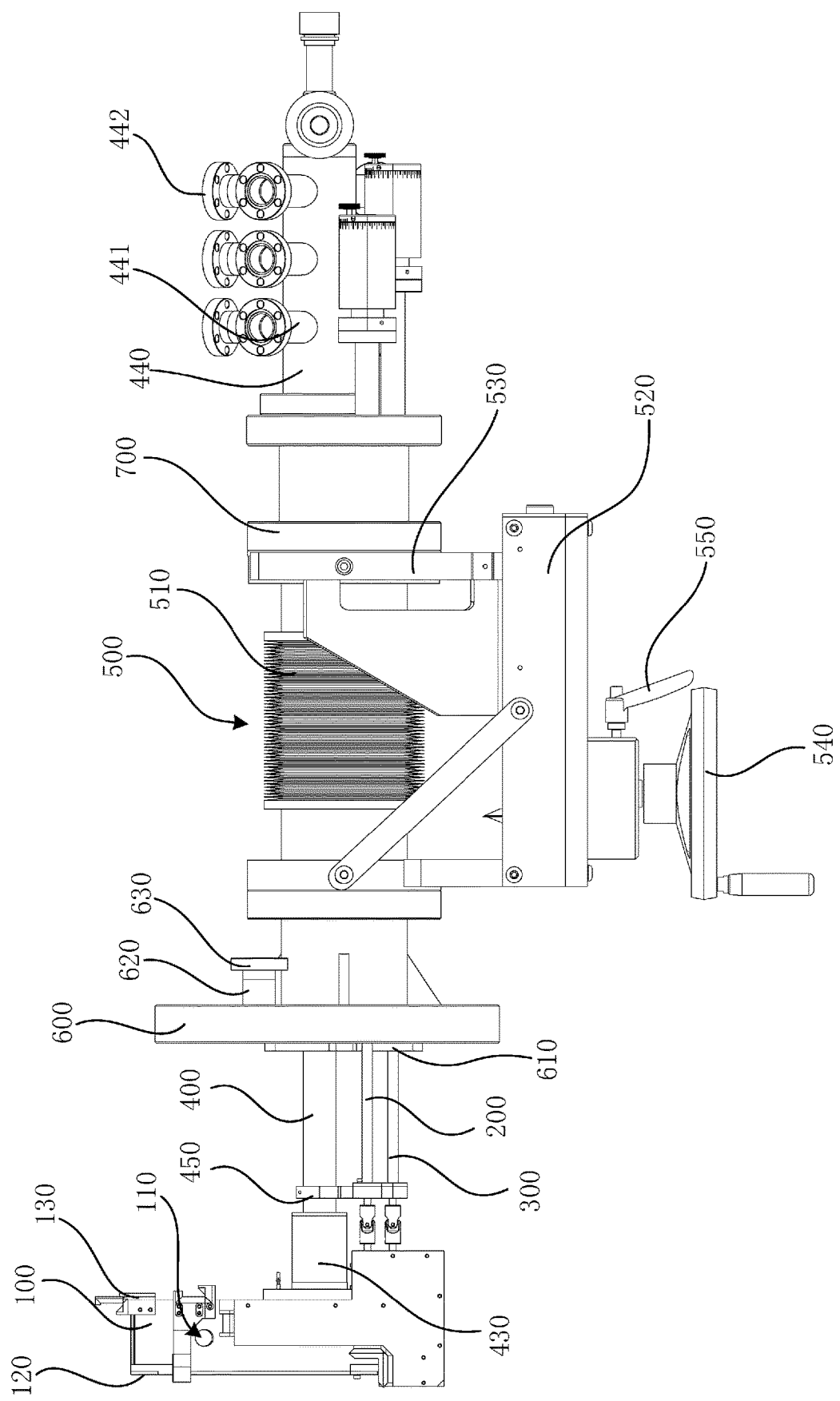
FIG. 1 is a front view of an in-situ testing device provided by an embodiment of the present disclosure.
Figure 2:
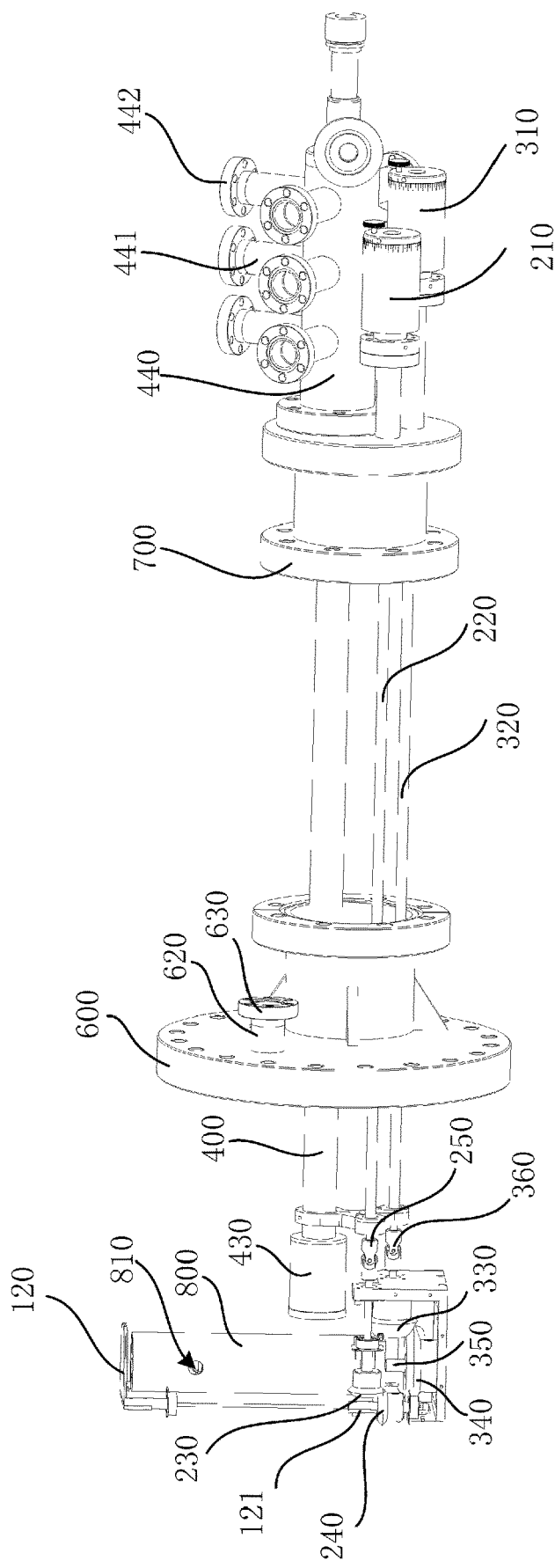
FIG. 2 is a schematic structural view of the structure shown in FIG. 1, without showing some components.

Referring to FIG. 1 and FIG. 2, in an embodiment of the present disclosure, the in-situ testing device 10 includes a measuring head 800, a drive mechanism 200, and a testing chamber 100. The testing chamber 100 is arranged on a sample transport line of the ultra-high vacuum system. The testing chamber 100 is provided with a first optical observation hole 110, and the measuring head 800 is provided with a second optical observation hole 810 whose position matches a position of the first optical observation hole 110. The testing chamber 100 is provided with an opening allowing the measuring head 800 to pass through. The testing chamber 100 is further provided with a shielding door 120, and the drive mechanism 200 is connected to the shielding door 120 and configured to drive the shielding door 120 to move relative to the testing chamber 100, to open or cover the opening, thereby opening or closing the testing chamber 100.

A shape of the testing chamber 100 can vary. For example, the testing chamber 100 can be in a shape of a circular cylinder, a rectangle, a cube, or a cylinder with a semicircular cross section, etc. It can be understood that the testing chamber 100 can be a cylindrical structure with a semicircular cross section, which makes it convenient to arrange the shielding door 120 on the testing chamber 100.

A position and a shape of the shielding door 120 can vary. For example, the shielding door 120 can be disposed on a side wall or on a top of the testing chamber 100, only if the shielding door can allow the measuring head 800 to pass. In an embodiment, the shielding door 120 is L-shaped, that is, an opening is disposed both on the top and in the side wall of the testing chamber 100. The shielding door 120 is configured to open or cover the opening, thereby opening or closing the testing chamber 100, and enabling the measuring head 800 to enter and exit the testing chamber 100 from multiple angles.

The connection mode between the shielding door 120 and the testing chamber 100 can be various. For example, the shielding door 120 can be rotatably or slidably connected to the testing chamber 100. The shielding door 120 can be provided with a door shaft, and the side wall of the testing chamber 100 can be provided with a bearing for fitting the door shaft.

The structure of the drive mechanism 200 can be various. For example, the drive mechanism 200 includes an electric extendable-contractile tube, an air cylinder or a hydraulic cylinder, etc. The drive mechanism 200 can be disposed between the shielding door 120 and the testing chamber 100, thereby realizing a movement of the shielding door 120 relative to the testing chamber 100.

Referring to FIG. 2, as an implementable embodiment, the drive mechanism 200 includes a first power unit 210 and a first transmission structure; the first power unit 210 is connected to the first transmission structure; and the first transmission structure is connected to the shielding door 120 and drives the shielding door 120. The power output by the first power unit 210 is transmitted to the shielding door 120 by the first transmission structure, so that the shielding door 120 moves or rotates relative to the testing chamber 100. In this case, during an actual application, the first power unit 210 can be disposed outside the ultra-high vacuum test system, to facilitate the operation of the tester. In this embodiment, a type of the first power unit 210 can be various. For example, the first power unit 210 can be a motor, a magnetic force rotation hand, and so on.

The structure of the first transmission structure can also be various. As an implementable embodiment, the first transmission structure includes a first driving gear 230 and a first driven gear 240. The shielding door 120 is provided with a door shaft 121, and the door shaft 121 is rotatably connected to the testing chamber 100. The first driven gear 240 is sleeved over the door shaft 121. The first power unit 210 is a first magnetic force rotation hand, and the first magnetic force rotation hand is connected to the first driving gear 230 through a first long rod 220. The first driving gear 230 meshes with the first driven gear 240. When the shielding door 120 needs to be opened or closed, the first magnetic force rotation hand drives the first long rod 220 to rotate, and the first long rod 220 drives the first driving gear 230 to rotate, thereby driving the first driven gear 240 meshing with the first driving gear 230 to rotate, and further driving the door shaft 121 to rotate. The first transmission structure drives the shielding door 120 to open or close relative to the testing chamber 100, which makes it convenient for the measuring head 800 to enter and exit the testing chamber 100.

In an embodiment, the first long rod 220 can be connected to the first driving gear 230 through a first universal joint 250. The first universal joint 250 connects the first long rod 220 to the first driving gear 230, thus a deviation caused by transmission is absorbed.

In other implementations, the first transmission structure can include a transmission rod and two connecting rods. First ends of the two connecting rods are rotatably connected to each other, a second end of one connecting rod is rotatably connected to the shielding door 120, and a second end of another connecting rod is rotatably connected to the testing chamber 100. The shielding door 120 is provided with the door shaft, and the door shaft is rotatably connected to the testing chamber 100. One end of the transmission rod is rotatably connected to the rotatably connected first ends of the two connecting rods, and another end of the transmission rod is connected to the first power unit 210. The first power unit 210 can be an electric extendable-contractile rod, a hydraulic cylinder, or an air cylinder, etc. When the shielding door 120 needs to be opened or closed, the first power unit 210 drives the transmission rod to move, thereby driving the two connecting rods to move, and further driving the shielding door 120 to rotate relative to the testing chamber 100, so that the shielding door 120 opens or closes relative to the testing chamber 100.

When the in-situ testing device 10 of each of the embodiments is specifically employed, the testing chamber 100 is installed in an ultra-high vacuum test system. Before the sample is moved to a different test environment, the sample and the probe are placed in the measuring head 800, and the shielding door 120 is opened by the drive mechanism 200. By means of the transportation device of the sample transportation line in the ultra-high vacuum test system, the measuring head 800 is placed into the testing chamber 100, so that the second optical observation hole 810 of the measuring head 800 is aligned with the first optical observation hole 110 of the testing chamber 100. The sample is aligned with the probe by means of optical observation, and the preliminary test is performed, to ensure that electrical properties are proper after the alignment; and then the measuring head 800 is transported by the transportation device of the sample transport line to a designated position in a next testing environment. The in-situ testing device 10 of the embodiments provides the tester with a test platform for aligning the sample with the probe by means of optical observation and testing various electrical properties of the sample, which makes an automatic operation of the preliminary test of the sample possible. Thus, there is no need to take the sample out from the ultra-high vacuum test environment, which greatly reduces operation steps to be performed by the tester and improves test efficiency. Moreover, it is ensured that the sample is always in the vacuum environment during tests, thereby achieving a protection for surface properties of the sample.

Figure 3:
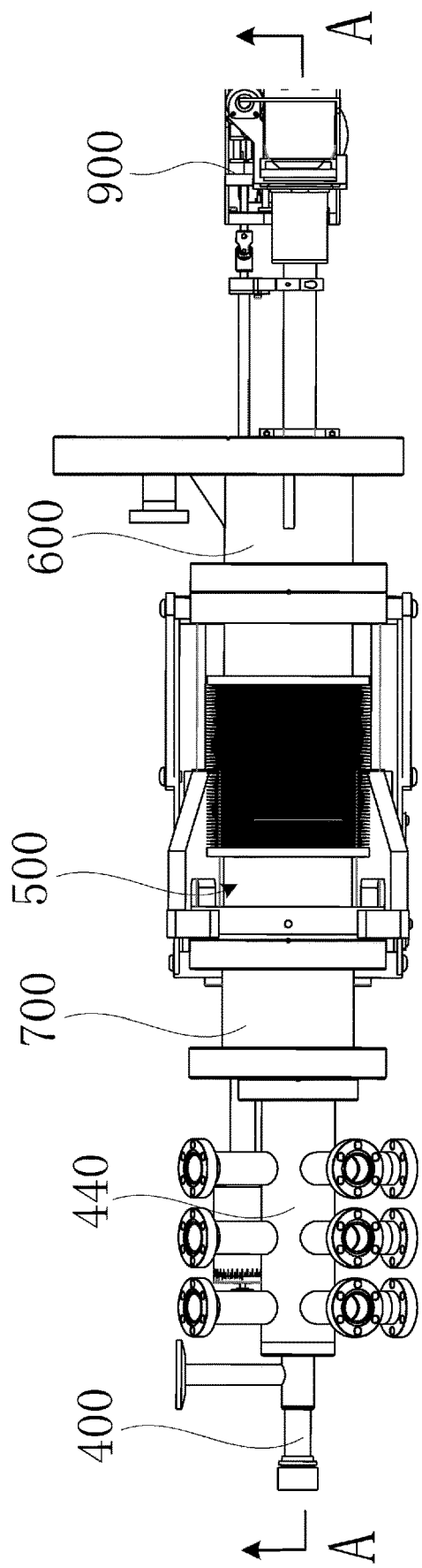
FIG. 3 is a top view of the structure shown in FIG. 1.
Figure 4:
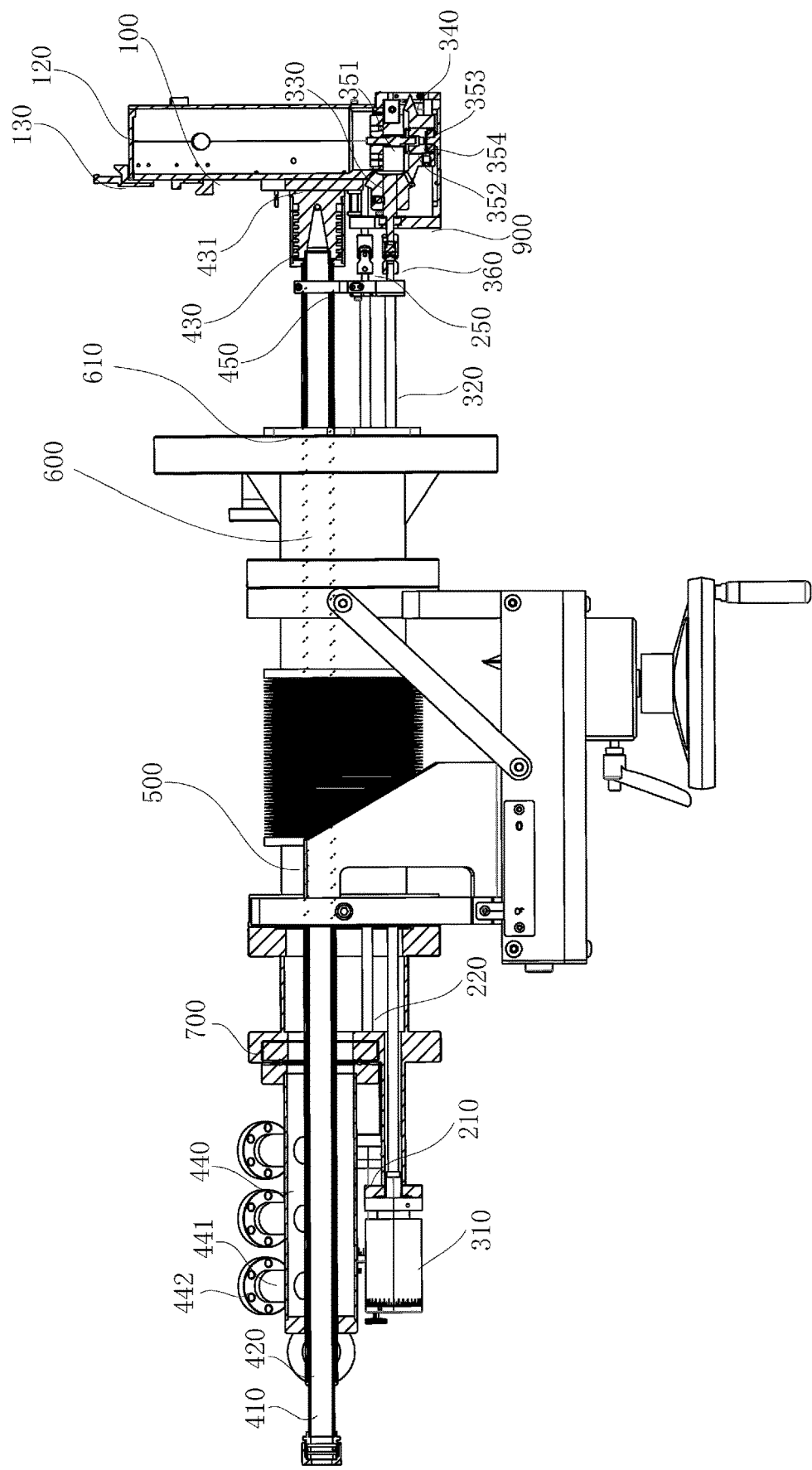
FIG. 4 is a cross-sectional view, along the A-A direction, of the structure shown in FIG. 3.

Referring to FIG. 3 and FIG. 4, as an implementable embodiment, the in-situ testing device 10 further includes an installing base 900; the testing chamber 100 is arranged on the installing base 900; and a bottom of the testing chamber 100 has a through hole. A locking structure 300 is disposed on the installing base 900 and below the through hole of the testing chamber 100. An interference structure (not shown in the figures) that fits the locking structure 300 is arranged on the measuring head 800. The locking structure 300 fits the interference structure to fix the measuring head 800 inside the testing chamber 100.

The structure of the locking structure 300 and the structure of the interference structure can be various. In an embodiment, the locking structure 300 includes a second power unit 310, a second transmission structure, and a threaded rod 350. The threaded rod 350 is arranged on the installing base 900 and can extend into the testing chamber 100 through the through hole. The interference structure includes a threaded hole disposed on the bottom of the measuring head 800 and fitting the threaded rod 350. The second power unit 310 is connected to the threaded rod 350 by the second transmission structure and configured to drive the threaded rod 350 to screw into the threaded hole, so that the measuring head 800 is fixed inside the testing chamber 100.

The structure of the second power unit 310 can vary. For example, the second power unit 310 can be an electric motor, an air cylinder, or a hydraulic cylinder, etc. In an embodiment, the second power unit 310 is a second magnetic force rotation hand. The second transmission structure includes a second driving gear 330 and a second driven gear 340. The second driven gear 340 is rotatably arranged in the installing base 900, and the second driven gear 340 is connected to the threaded rod 350. The second magnetic force rotation hand is connected to the second driving gear 330 by a second long rod 320, and the second driving gear 330 meshes with the second driven gear 340. Of course, the second transmission structure can also have another structure, only if it can drive the threaded rod 350 to screw into or out from the threaded hole.

In an embodiment, the threaded rod 350 includes a first part 351, a second part 353, and an elastic member 354. The first part 351 is rod-shaped and includes a threaded portion at an upper end and a cylindrical portion at a lower end. Position restricting surfaces 352 are disposed on opposite side walls of the cylindrical portion. The second part 353 is connected to the second driven gear 340; the second part 353 has a receiving hole for receiving the cylindrical portion; and the elastic member 354 is disposed inside the receiving hole and abuts against the cylindrical portion. An insertion hole is disposed in a side wall of the receiving hole and penetrates the side wall thereof. A restricting member is configured to be inserted into the insertion hole and abuts against the position restricting surfaces 352, thus preventing the first part 351 from rotating relative to the second part 353. By means of the threaded rod 350 including the first part 351, the second part 353, and the elastic member 354, it is possible to reduce damage to the screws of the threaded rod 350 and the threaded hole by alleviating the effects of external forces. By arranging the restricting member and the position restricting surfaces 352, the first part 351 and the second part 353 can be prevented from rotating relatively, which facilitates the connection between the threaded rod 350 and the threaded hole. It can be understood that the restricting member can be a bolt, a pin, or the like.

In an embodiment, a bearing hole for receiving a bearing is disposed at an end of the second part 353, and the end of the second part 353 is away from the first part 351. The second part 353 is rotatably connected to the installing base 900 through a rotating bearing, so that, the second driven gear 340 can rotate more smoothly.

In addition, the second long rod 320 can be connected to the second driving gear 330 by a second universal joint 360. The second universal joint 360 connects the second long rod 320 to the second driving gear 330, thus a deviation caused by the transmission can be absorbed.

In other embodiments, the locking structure 300 can further include two electric extendable-contractile tubes, and the two electric extendable-contractile tubes are relatively disposed inside the testing chamber 100. One end of each electric extendable-contractile tube is connected to an inner side wall of the testing chamber 100, and another end of each electric extendable-contractile tube is provided with an arc-shaped pad for clamping the measuring head 800. The lower end of the measuring head 800 can be provided with an annular groove for clamping each arc-shaped pad. When the measuring head 800 is placed into the testing chamber 100, the two electric extendable-contractile tubes move towards the measuring head 800, so that each arc-shaped pad is clamped in the annular groove disposed at the lower end of the measuring head 800, and that the measuring head 800 can be fixed in the testing chamber 100 by the two arc-shaped pads.

Figure 5:
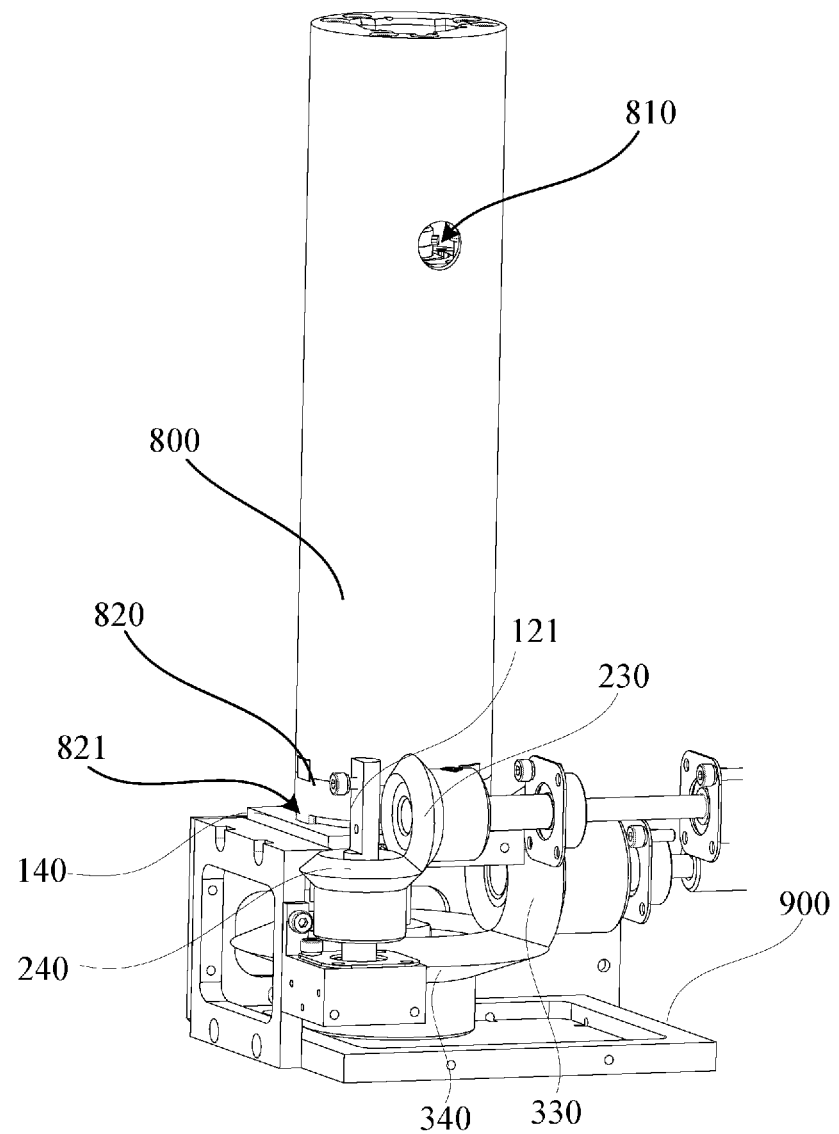
FIG. 5 is a schematic structural view illustrating connections between a measuring head, an electrode base and an installing base of the in-situ testing device according to an embodiment of the present disclosure.

Also referring to FIG. 5, as an implementable embodiment, the in-situ testing device 10 further includes a first electrode adapter plate 820 arranged at the lower end of the measuring head 800. The testing chamber 100 is provided with an electrode base 140 oppositely joined to the first electrode adapter plate 820. To make it easier for the tester to quickly align the first electrode adapter plate 820 with the electrode base 140, a plurality of grooves are asymmetrically disposed on the electrode base 140, and a plurality of protrusions 821 respectively fitting the plurality of grooves are disposed at the lower end of the measuring head 800. The plurality of grooves fit the plurality of protrusions 821, so that the first electrode adapter plate 820 is aligned with the electrode base 140 to form an electrical connection.

Figure 6:
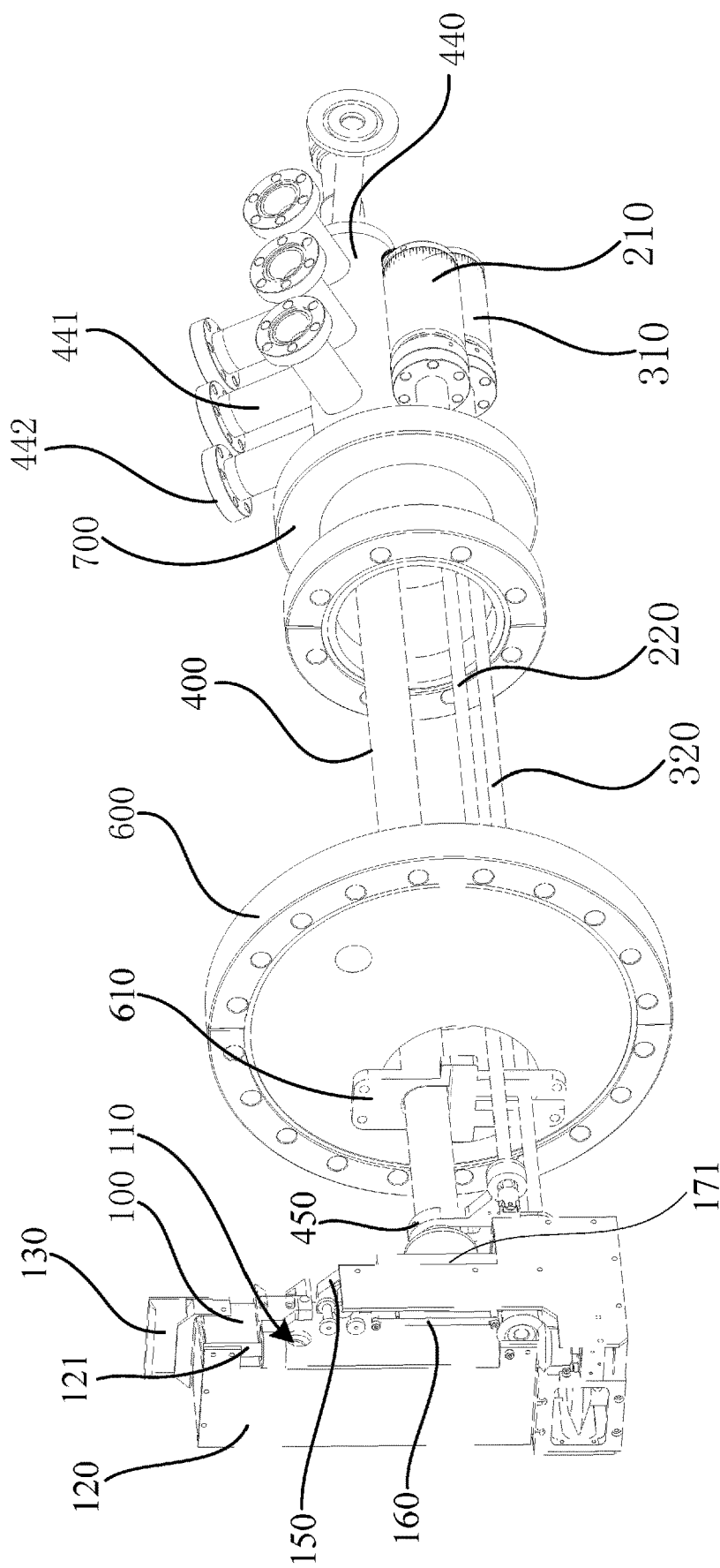
FIG. 6 is a first perspective view of the structure shown in FIG. 1, without showing a hollow linear propelling component.
Figure 7:
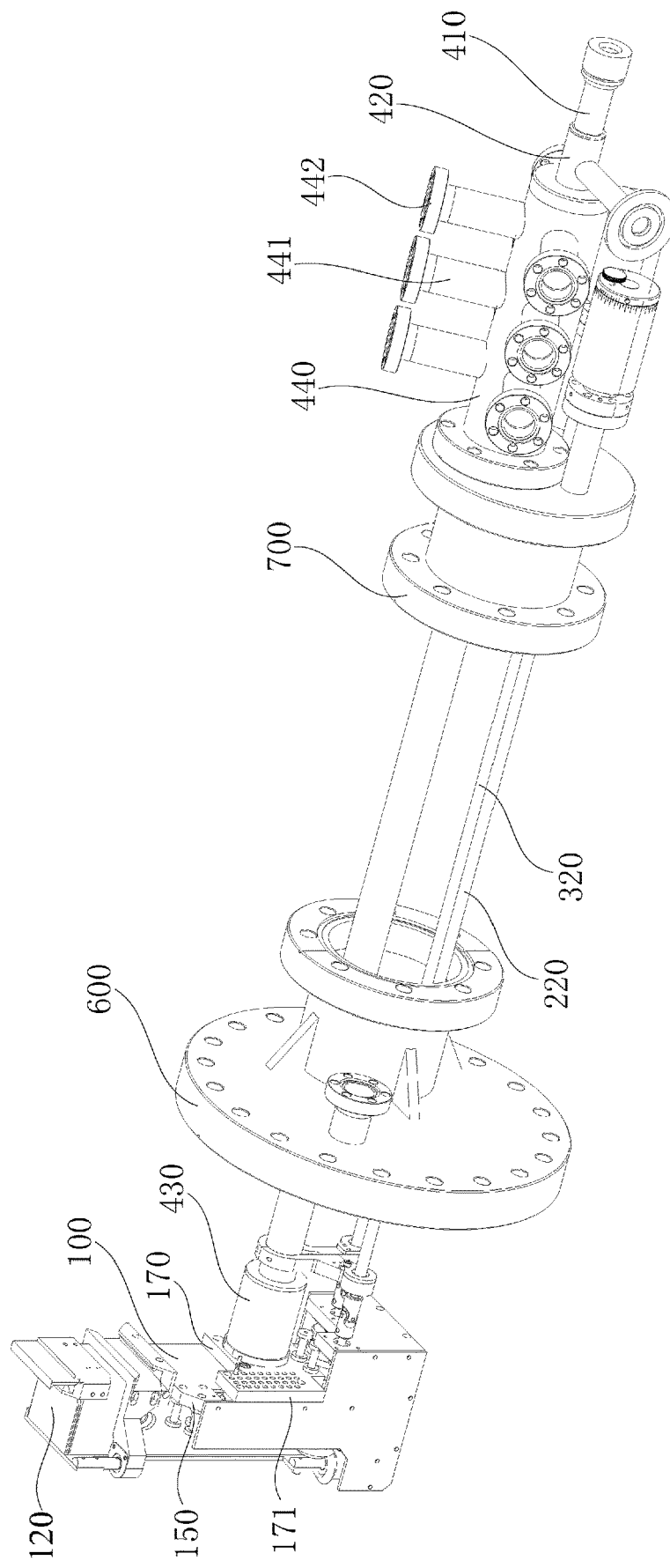
FIG. 7 is a second perspective view of the structure shown in FIG. 1, without showing the hollow linear propelling component.

Referring to FIGS. 4, 6 and 7, as an implementable embodiment, the in-situ testing device 10 further includes a cold rod 400 and a cooling component 430. The cold rod 400 includes an inner tube 410 and an outer tube 420 which are arranged concentrically, and the cooling component 430 is arranged at one end of the cold rod 400. The inner tube 410 and the outer tube 420 communicate by means of the cooling component 430. The cooling component 430 is connected to the testing chamber 100. Another end of the cold rod 400, which is away from the cooling component 430, communicates with an external cooling device. The refrigerant flows into the inner tube 410 and flows out from the outer tube 420, so as to reduce a temperature of the measuring head 800. The temperature of the measuring head 800 is reduced by the cold rod 400, so that the tester can adjust the temperature inside the testing chamber 100 according to the requirements of the experiment.

The connection manner between the cold rod 400 and the testing chamber 100 can be various. For example, the in-situ testing device 10 further includes a connecting board 170 connected to the testing chamber 100. The connecting board 170 and the cooling component 430 are provided with a plurality of third threaded holes corresponding to each other. It can be understood that the connecting board 170 can also be provided with a fourth threaded hole for connecting the connecting board 170 to the testing chamber 100. A connecting member (such as a screw, etc.) sequentially passes through one of the third threaded holes in the connecting board 170 and one of the third threaded holes in the cooling component 430 to realize the connection between the connecting board 170 and the cold rod 400. The connecting member passes through the fourth threaded hole in the connecting board 170 to realize the connection between the connecting board 170 and the testing chamber 100. So that, the connection between the cold rod 400 and the testing chamber 100 is achieved.

In an embodiment, the in-situ testing device 10 further includes a second electrode adapter plate 171 connected to one side of the connecting board 170. A third electrode adapter plate 150 corresponding to the second electrode adapter plate 171 is provided on a side wall of the testing chamber 100. The connecting board 170 not only facilitates the connection between the cold rod 400 and the testing chamber 100, but also makes it easier to achieve a wire connection between the testing chamber 100 and an external device or between the testing chamber 100 and other components of the whole device by means of the second electrode adapter plate 171 and the third electrode adapter plate 150.

Of course, a heat sink can be provided on the second electrode adapter plate 171, and the heat sink can organize and cool the wires. The wires running from a room temperature environment are spirally wound on the cold rod 400 and then connected to the cooling component 430 of the cold rod 400, and at this time, the temperature of the wires has not yet fallen to a required temperature. Part of the wires are bonded on the heat sink, and the heat sink is tightly attached to the cold rod 400, thus better cooling the wires at this position, and ensuring that not too much heat is introduced into the testing chamber 100. In addition, when the electrodes are disposed on the second electrode adapter plate 171 and the third electrode adapter plate 150, the electrodes can be sleeved with insulating pads, which not only improves stability of the electrodes, but also avoids leakage of electricity.

In addition, in order to prevent the first transmission structure, namely the first driven gear 240 and the first driving gear 230, from being entangled with the wires during operation, a U-shaped wire combing rod 160 for combing the wires is arranged at a side of the third electrode adapter plate 150, and the side of the third electrode adapter plate 150 is away from the second electrode adapter plate 171. Two ends of the U-shaped wire combing rod 160 can be connected to the third electrode adapter plate 150. By arranging the U-shaped wire combing rod 160, the wires can be supported, thereby preventing the wires from being entangled with the first driven gear 240 and the first driving gear 230.

As an implementable embodiment, the in-situ testing device 10 further includes a first supporting member 450 sleeved over the outer tube 420, and the first supporting member 450 is configured to support the cold rod 400. It can be understood that the first supporting member 450 can also support the first long rod 220 and the second long rod 320. The first supporting member 450 makes the positions of the first long rod 220, the second long rod 320, and the cold rod 400 relatively fixed, thus the cold rod 400, the first long rod 220, and the second long rod 320 move more stably and do not interfere with each other. In addition, in order to make the first long rod 220 and the second long rod 320 move more smoothly, the first supporting member 450 can be provided with a bearing for cooperating with the first long rod 220 and the second long rod 320.

Referring to FIG. 4, FIG. 6 and FIG. 7, as an implementable embodiment, the in-situ testing device 10 further includes a connecting flange 600 and a hollow linear propelling component 500, which are sleeved over the outer tube 420. A first end of the connecting flange 600 is provided with a second supporting member 610, and the second supporting member 610 is provided with a first rod hole allowing the cold rod 400 to pass. The first end of the connecting flange 600 is configured to connect an external fixed component. A first end of the hollow linear propelling component 500 is connected to a second end of the connecting flange 600, and the second end of the connecting flange 600 is away from the second supporting member 610. A second end of the hollow linear propelling component 500 is connected to the cold rod 400. The hollow linear propelling component 500 is configured to drive the cold rod 400 to move, so as to drive the testing chamber 100 to move. It should be noted that the second supporting member 610 also has holes allowing the first long rod 220 and the second long rod 320 to pass. Moreover, the hollow linear propelling component 500 not only drives the cold rod 400 to move, but also drives the first long rod 220 and the second long rod 320 to move.

The hollow linear propelling component 500 is configured to drive the testing chamber 100 to move in the ultra-high vacuum test system, so that the measuring head 800 in the testing chamber 100 can move to a position above next test device, thereby making it easy for the transportation device of the sample transportation line in the ultra-high vacuum test system to transport the measuring head 800 to a designated position. The arrangement of the first supporting member 450 and the second supporting member 610 is conducive to improving smoothness of the movement of the testing chamber 100.

When the in-situ testing device 10 is in operation, the connecting flange 600 is connected to an external fixed object (for example, an outer casing of the ultra-vacuum test system), and the testing chamber 100 is located in the ultra-vacuum test system. When the testing chamber 100 needs to be moved in the ultra-vacuum test system, the hollow linear propelling component 500 is driven to move. The first end of the hollow linear propelling component 500 is connected to the connecting flange 600, and the connecting flange 600 is connected to the external fixed object, therefore the hollow linear propelling component 500 drives the cold rod 400, the first long rod 220, and second long rod 320 to move, thereby driving the testing chamber 100 to move.

In an embodiment, the in-situ testing device 10 further includes a first adapter flange 700 connected to the second end of the hollow linear propelling component 500, the second end is away from the connecting flange 600. The cold rod 400 is installed on the first adapter flange 700, and the hollow linear propelling component 500 is connected to the cold rod 400 through the first adapter flange 700. That is, the cold rod 400 is installed on the first adapter flange 700, and the hollow linear propelling component 500 is also connected to the first adapter flange 700. It can be understood that the first long rod 220 and the second long rod 320 can also be rotatably connected to the first adapter flange 700. In this embodiment, the hollow linear propelling component 500 can drive the first adapter flange 700 to move, and further drive the cold rod 400, the first long rod 220, and the second long rod 320 to move, thereby driving the testing chamber 100 to move. In this case, the stability of the movement of the testing chamber 100 is improved, and the overall structure is more stable and reasonable.

In addition, the in-situ testing device 10 further includes a wiring tube 440 sleeved over the outer tube 420. One end of the wiring tube 440 is connected to the first adapter flange 700, and another end of the wiring tube 440 is welded to the outer tube 420.

Multiple threading tubes 441 can be provided on the wiring tube 440, and each threading tube 441 communicates with the wiring tube 440. Moreover, an end of each threading tube 441, which is away from the wiring tube 440, is provided with a first small flange 442 to connect external devices. In this case, by means of the wiring tube 440 and the threading tubes 441, various required external devices can be electrically connected to the in-situ testing device 10.

Inner walls of the wiring tube 440, the hollow linear propelling component 500, the connecting flange 600, and the first adapter flange 700 are all spaced from an outer wall of the outer tube 420 to form space for receiving the wires, which facilitate the wiring of the in-situ testing device 10.

Figure 8:
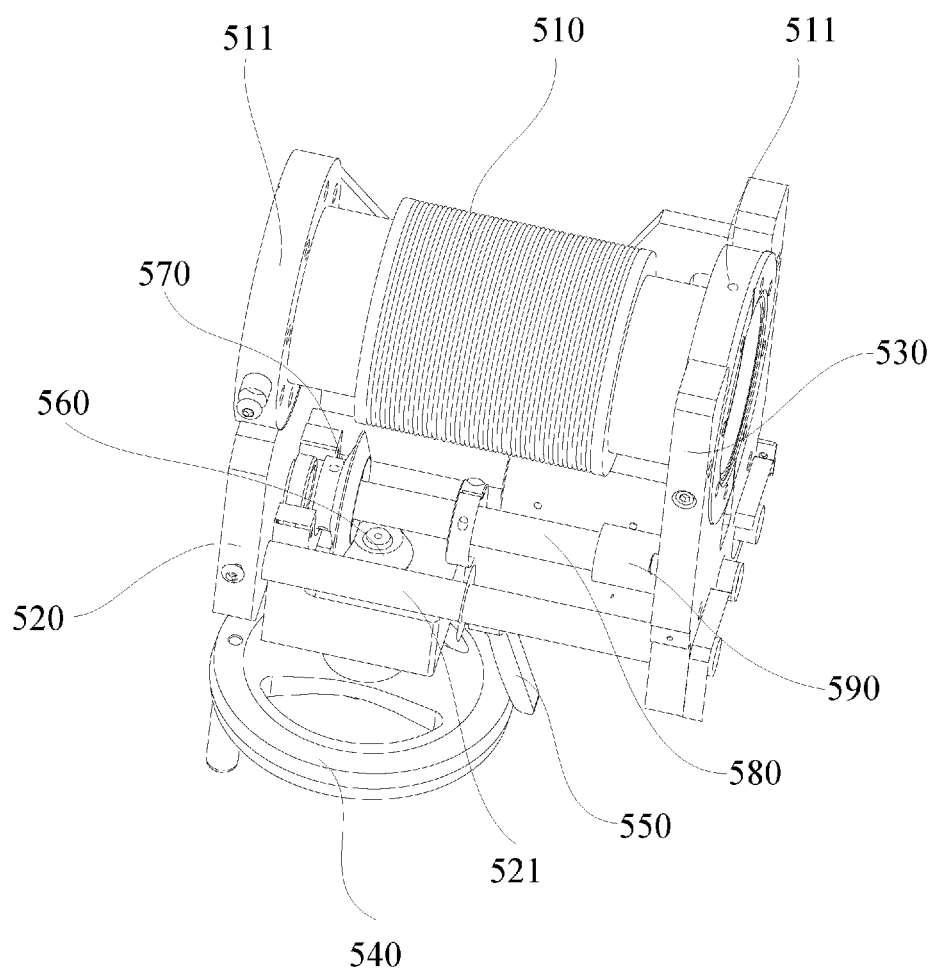
FIG. 8 is a schematic structural view of the hollow linear propelling component of the in-situ testing device according to an embodiment of the present disclosure.

Referring to FIG. 8, as an implementable embodiment, the hollow linear propelling component 500 includes an extendable-contractile tube 510, a support 520, a power structure 540, a third driving gear 560, a third driven gear 570, a threaded shaft 580, and a nut 590. The support 520 is provided with a slide rail 521; a slide plate 530 is slidably disposed on the slide rail 521; and the nut 590 is provided on the slide plate 530. The third driven gear 570 is rotatably disposed on the support 520 and connected to one end of the threaded shaft 580, and another end of the threaded shaft 580 is rotatably disposed in the nut 590.

The power structure 540 is arranged on the support 520 and connected to the third driving gear 560 to drive the third driving gear 560 to rotate. The third driving gear 560 meshes with the third driven gear 570. A moving process of the hollow linear propelling component 500 is as follows: the power structure 540 drives the third driving gear 560 to rotate, thereby driving the third driven gear 570 to rotate, forcing the nut 590 to move over the threaded shaft 580, and further driving the slide plate 530 to move on the slide rail 521.

Two ends of the extendable-contractile tube 510 each are provided with a second adapter flange 511. One end of the extendable-contractile tube 510 is connected to the support 520 by one second adapter flange 511, and another end of the extendable-contractile tube 510 is attached to the slide plate 530 by another second adapter flange 511. The extendable-contractile tube 510 is sleeved over the outer tube 420, and the two second adapter flanges 511 are connected to the connecting flange 600 and the first adapter flange 700 respectively.

When the testing chamber 100 needs to be moved, the power structure 540 drives the third driving gear 560 to rotate, thereby driving the third driven gear 570 to rotate, and further driving the threaded shaft 580 to rotate. The nut 590 is arranged on the slide plate 530, and the slide plate 530 is slidably arranged on the slide rail 521 of the support 520, therefore the nut 590 moves along the axial direction of the threaded shaft 580, thereby forcing the slide plate 530 to move along the slide rail 521 of the support 520, forcing the extendable-contractile tube 510 to expand and contract, and further driving the first adapter flange 700 to move relative to the connecting flange 600, so that the cold rod 400 moves, and finally the testing chamber 100 moves in the ultra-vacuum test system.

The power structure 540 can include a hand wheel, and the hand wheel drives the third driving gear 560 to rotate. It can be understood that a positioning member 550 can be disposed at an output shaft of the hand wheel to control the rotation of the output shaft. When the hand wheel rotates and drives the testing chamber 100 to move to the designated position, the positioning member 550 keeps the hand wheel at a current position and not rotating. Of course, the power structure 540 can also be a stepper motor, and the stepper motor drives the third driving gear 560 to rotate. The stepper motor stops operating when the testing chamber 100 moves to the designated position.

Referring to FIG. 1 and FIG. 2, as an implementable embodiment, the connecting flange 600 can also be provided with a pipe body 620 for observing, illuminating, or leading out signal lines. The pipe body 620 can be provided with a second small flange 630 for connecting external device.

As an implementable embodiment, the outer surface of the testing chamber 100 can also be provided with a sample transfer guiding groove 130. The sample transfer guiding groove 130 is configured to cooperate with an external guide rail and functions as a guide during a transfer of the sample, thereby reducing the influence of processing errors of parts and the influence of shakes of the front end of the sample transfer rod when the sample is transferred over a long distance.

In the in-situ testing device 10 of the embodiments of the present disclosure, when it is necessary for the tester to test the sample in different test environments, or when the sample is to be placed in the test environment where the optical observation method cannot be adopted, the in-situ testing device 10 can be installed in the ultra-vacuum test system. The installation mode is various. For example, a square chamber can be specially made according to the requirements of those skilled in the art, and a plurality of flanges that communicate with other components in the ultra-vacuum test system can be arranged on the square chamber. The testing chamber 100 is placed inside the square chamber, and then the connecting flange 600 is fixedly connected to the square chamber, so that the testing chamber 100 is installed inside the square chamber. Testing equipment (such as the Dewar) with a different test environment is also installed in the square chamber and can be disposed below the testing chamber 100. The sample transportation line of the ultra-vacuum test system is disposed above the testing chamber 100.

Before the tester tests the sample, the sample and the probe can be placed inside the measuring head 800. The hollow linear propelling component 500 drives the testing chamber 100 to move to a first position. The drive mechanism 200 opens the shielding door 120; then the measuring head 800 is placed into the testing chamber 100; then the drive mechanism 200 closes the shielding door 120. The measuring head 800 is fixed in the testing chamber 100 by the locking structure 300; at this time, the first optical observation hole 110 and the second optical observation hole 810 correspond to each other. The tester tests the sample and obtains related data by means of the optical observation method. After the test is completed, the hollow linear propelling component 500 drives the testing chamber 100 to move to a second position, that is, the testing chamber 100 is moved to a position above the testing equipment (such as the Dewar) with a different detecting environment. The drive mechanism 200 opens the shielding door 120; the locking structure 300 releases the measuring head 800; then the measuring head 800 is placed to the designated position of the testing equipment (such as the Dewar) having the different test environment by the transportation device in the ultra-vacuum test system.

All technical features in the embodiments can be arbitrarily combined. For purpose of simplifying the description, not all arbitrary combinations of the technical features in the embodiments illustrated above are described. However, as long as such combinations of the technical features are not contradictory, they should be considered to be within the scope of the specification of the disclosure.

The above embodiments are merely illustrations of several implementations of the present application, and the description thereof is more specific and detailed, but should not be deemed as limitations to the scope of the present application. It should be noted that, for those skilled in the art, various deformations and improvements can be made without departing from the concepts of the present application. All these deformations and improvements are within the protection scope of the present application. Therefore, the protection scope of the present application is defined by the appended claims.

What is claimed is:

1. An in-situ testing device, comprising:
   a testing chamber arranged on a sample transport line of an ultra-high vacuum system, the testing chamber being provided with a first optical observation hole, the testing chamber being further provided with a shielding door;
   a measuring head capable of being connected to the testing chamber, the measuring head being provided with a second optical observation hole whose position matches a position of the first optical observation hole, the testing chamber being provided with an opening allowing the measuring head to pass; and
   a drive mechanism connected to the shielding door and configured to drive the shielding door to move relative to the testing chamber, to open or cover the opening, thereby opening or closing the testing chamber, the drive mechanism comprising a first power unit and a first transmission structure; the first power unit being connected to the first transmission structure; and the first transmission structure being connected to the shielding door and drives the shielding door.

2. The in-situ testing device according to claim 1, wherein the opening extends from an end of the testing chamber to a side wall of the testing chamber; the shielding door is L-shaped; and one edge of the shielding door is rotatably connected to the side wall of the testing chamber.

3. The in-situ testing device according to claim 2, wherein the first transmission structure comprises a first driving gear and a first driven gear; the shielding door is provided with a door shaft; the door shaft is rotatably connected to the testing chamber; and the first driven gear is sleeved over the door shaft;
   the first power unit is a first magnetic force rotation hand; the first magnetic force rotation hand is connected to the first driving gear by a first long rod; and the first driving gear meshes with the first driven gear.

4. The in-situ testing device according to claim 3, wherein the first long rod is connected to the first driving gear by a first universal joint.

5. The in-situ testing device according to claim 1, further comprising an installing base, wherein the testing chamber is arranged on the installing base, a bottom of the testing chamber has a through hole;
   a locking structure is disposed on the installing base and below the through hole of the testing chamber;
   an interference structure is disposed on the measuring head and fits the locking structure to fix the measuring head inside the testing chamber.

6. The in-situ testing device according to claim 5, wherein the locking structure comprises a second power unit, a second transmission structure, and a threaded rod; the threaded rod is arranged on the installing base and extends into the testing chamber through the through hole;
   the interference structure comprises a threaded hole disposed on a bottom of the measuring head and fitting the threaded rod; the second power unit is connected to the threaded rod by the second transmission structure, and configured to drive the threaded rod to screw into the threaded hole, thereby fixing the measuring head inside the testing chamber.

7. The in-situ testing device according to claim 6, wherein the second transmission structure comprises a second driving gear and a second driven gear; the second driven gear is rotatably arranged in the installing base; the second driven gear is connected to the threaded rod;

the second power unit is a second magnetic force rotation hand; the second magnetic force rotation hand is connected to the second driving gear by a second long rod; and the second driving gear meshes with the second driven gear.

8. The in-situ testing device according to claim 7, wherein the second long rod is connected to the second driving gear by a second universal joint.

9. The in-situ testing device according to claim 7, wherein the threaded rod comprises a first part, a second part, and an elastic member; the first part is rod-shaped and comprises a threaded portion at an upper end and a cylindrical portion at a lower end; position restricting surfaces are disposed on opposite side walls of the cylindrical portion;

the second part is connected to the second driven gear; the second part has a receiving hole for receiving the cylindrical portion; and the elastic member is disposed inside the receiving hole and abuts against the cylindrical portion;

an insertion hole is disposed in a side wall of the receiving hole and penetrates the side wall thereof; a restricting member is configured to be inserted into the insertion hole and abut against the position restricting surfaces; and the first part is prevented from rotating relative to the second part.

10. The in-situ testing device according to claim 1, further comprising a first electrode adapter plate arranged at a lower end of the measuring head; the testing chamber is provided with an electrode base oppositely joined to the first electrode adapter plate;

a plurality of grooves are asymmetrically disposed on the electrode base; a plurality of protrusions respectively fitting the plurality of grooves are disposed at the lower end of the measuring head; the plurality of grooves fit the plurality of protrusions; and the first electrode adapter plate is aligned with the electrode base.

11. The in-situ testing device according to claim 1, further comprising a cold rod comprising an inner tube and an outer tube arranged concentrically; and a cooling component arranged at one end of the cold rod; wherein the inner tube and the outer tube communicate by means of the cooling component;

the cooling component is connected to the testing chamber, and another end of the cold rod, which is away from the cooling component, communicates with an external cooling device in order to allow refrigerant to flow into the inner tube and flow out from the outer tube, thereby reducing a temperature of the measuring head.

12. The in-situ testing device according to claim 11, further comprising a connecting board connected to the testing chamber, wherein the connecting board and the cooling component are provided with a plurality of third threaded holes corresponding to each other.

13. The in-situ testing device according to claim 12, further comprising a second electrode adapter plate connected to one side of the connecting board, wherein a third electrode adapter plate is disposed on a side wall of the testing chamber and corresponds to the second electrode adapter plate.

14. The in-situ testing device according to claim 13, further comprising a U-shaped wire combing rod arranged at a side of the third electrode adapter plate away from the second electrode adapter plate, wherein the U-shaped wire combing rod is configured to comb wires.

15. The in-situ testing device according to claim 11, further comprising a first supporting member sleeved over the outer tube, wherein the first supporting member is configured to support the cold rod.

16. The in-situ testing device according to claim 11, further comprising a connecting flange and a hollow linear propelling component, which are sleeved over the outer tube;

wherein a first end of the connecting flange is provided with a second supporting member; and the second supporting member is provided with a first rod hole allowing the cold rod to pass; the first end of the connecting flange is configured to connect an external fixed component;

a first end of the hollow linear propelling component is connected to a second end of the connecting flange, and the second end of the connecting flange is away from the second supporting member; a second end of the hollow linear propelling component is connected to the cold rod; the hollow linear propelling component is configured to drive the cold rod to move, thereby driving the testing chamber to move.

17. The in-situ testing device according to claim 16, further comprising a first adapter flange connected to the second end of the hollow linear propelling component, wherein the second end is away from the connecting flange; the cold rod is installed on the first adapter flange; and the hollow linear propelling component is connected to the cold rod through the first adapter flange.

18. The in-situ testing device according to claim 17, further comprising:

a wiring tube sleeved over the outer tube, wherein one end of the wiring tube is connected to the first adapter flange, and another end of the wiring tube is welded to the outer tube;

multiple threading tubes disposed on the wiring tube, wherein each threading tube communicates with the wiring tube; and multiple first small flanges respectively disposed on ends of the multiple threading tubes away from the wiring tube, wherein the multiple first small flanges are configured to connect external devices;

inner walls of the wiring tube, the hollow linear propelling component, the connecting flange, and the first adapter flange are spaced from an outer wall of the outer tube to form space for receiving wires.

19. The in-situ testing device according to claim 16, wherein the hollow linear propelling component comprises an extendable-contractile tube, a support, a power structure, a third driving gear, a third driven gear, a threaded shaft, and a nut; the support is provided with a slide rail; a slide plate is slidably disposed on the slide rail; the nut is arranged on the slide plate; the third driven gear is rotatably disposed on the support and connected to one end of the threaded shaft; another end of the threaded shaft is rotatably disposed in the nut;

the power structure is arranged on the support and connected to the third driving gear to drive the third driving gear to rotate; the third driving gear meshes with the third driven gear;

two ends of the extendable-contractile tube each are provided with a second adapter flange; one end of the extendable-contractile tube is attached to the support by means of one second adapter flange, and another end of the extendable-contractile tube is attached to the slide plate by another second adapter flange; the extendable-contractile tube is sleeved over the outer tube, and the two second adapter flanges are connected to the connecting flange and the first adapter flange respectively.

* * * * *